United States Patent
Lin et al.

(10) Patent No.: US 6,494,725 B2
(45) Date of Patent: Dec. 17, 2002

(54) ELECTRICAL CONNECTOR

(75) Inventors: Fen-Yuen Lin, Taipei (TW); Pei-Cheng Chao, Taipei (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/934,893

(22) Filed: Aug. 22, 2001

(65) Prior Publication Data

US 2002/0045368 A1 Apr. 18, 2002

(51) Int. Cl.$^7$ .............................................. H01R 12/00
(52) U.S. Cl. ...................................................... 439/83
(58) Field of Search ........................ 439/83, 182, 876; 257/738

(56) References Cited

U.S. PATENT DOCUMENTS

| | | | | |
|---|---|---|---|---|
| 4,075,759 A | * | 2/1978 | Sochor | 29/845 |
| 6,016,254 A | | 1/2000 | Pfaff | 361/769 |
| 6,024,584 A | | 2/2000 | Lemke et al. | 439/83 |
| 6,056,558 A | | 5/2000 | Lin et al. | 439/83 |
| 6,116,923 A | * | 9/2000 | Szu | 439/70 |
| 6,139,336 A | | 10/2000 | Olson | 439/83 |
| 6,210,198 B1 | | 4/2001 | McHugh et al. | 439/342 |
| 6,217,348 B1 | | 4/2001 | Lin et al. | 439/83 |

* cited by examiner

Primary Examiner—Neil Abrams
Assistant Examiner—Phuong Dinh
(74) Attorney, Agent, or Firm—Robert J. Zeitler

(57) ABSTRACT

A surface mountable electrical connector is provided for connecting an electronic component (such as a central processing unit) to a circuit board includes an insulative housing, having a receiving surface for receiving the electronic component, and a mounting surface for attachment to the circuit board. The housing has a plurality of through holes formed therein which extend between the receiving and mounting surfaces. The mounting surface is provided with a plurality of depressions that are sunken toward the interior of the housing and which are disposed proximate to the through holes. Conductive terminals are received within the through holes and free ends of the terminals extend outwardly from the through holes and are bent obliquely toward the depression so that a free end of the terminal is received within the depression to thereby form a mounting portion so that a solder ball can be attached to the mounting portion. A side wall of the depression facilitates the positioning of the solder ball on the mounting portion.

20 Claims, 7 Drawing Sheets

(PRIOR ART)

(PRIOR ART)

(PRIOR ART)

(PRIOR ART)

ELECTRICAL CONNECTOR

BACKGROUND OF THE INVENTION

The present invention relates to an electrical connector structure for an electronic product, and more particularly to an electrical connector structure that is surface mountable.

For electronic products that are commonly circulated in the marketplace, consumers would, aside from expecting them to achieve specific functions, particularly demand that they have various shapes and light weight. In order to have various shapes and light weight, the internal electronic components of the electronic products have to be developed in the direction of compactness, and how to connect an electrical connector and a circuit board in a compact manner is an important subject. A conventional way of connecting an electrical connector and a circuit board is to form holes in the circuit board. That is, terminals of the electrical connector pass through through holes which are formed in the circuit board, and which are fixedly connected to corresponding contacts on the circuit board distal to the electrical connector. However, in such a connecting method, the through holes in the circuit board take up a large percentage of the wiring area of the circuit board, which is undesirable. Therefore, it becomes a problem to be solved as to how an electrical connector can be connected to a circuit board without forming holes in the latter.

At present, there are available circuit boards that are not provided with through holes, and wiring is conducted on a surface of the circuit board which is proximate to the electrical connector. The corresponding contacts on the circuit board are directly connected to the terminals of the electrical connector via solder balls after heating the latter, thereby establishing electrical connections. FIG. 1 illustrates such a known connector and shows the relative relationship among an electrical connector 7, an electronic component 6 and a circuit board 8. FIG. 2 is a sectional view taken along line A—A of FIG. 1, and illustrates a surface 82 of the circuit board 8 that is proximate to the electrical connector 7 is provided with corresponding contacts 84. A plurality of terminals 78 of the electrical connector 7 are each disposed in respective single through holes 76 in an insulating housing 70, with the end portions 782 of the terminals 78 slightly extending past a surface 72 of the insulating housing 70. A solder ball 71 is pre-planted in the terminal end portion 782. The electrical connector 7 with the pre-planted solder balls 71 is then brought near the circuit board 8 such that the solder ball 71 attached to each terminal end portion 782 is in contact with the corresponding contact 84 on the circuit board 8. After heating, the electrical connection is established.

Further, in another known electrical connector, as disclosed in R.O.C. Patent Publication No. 383963 and as illustrated in FIG. 3, each of a plurality of through holes 76 formed in an insulating housing 70 of an electrical connector 7 has one end located proximate to a circuit board 8 and configured to have a spherically curved matching surface 762. Each of a plurality of terminals 78 has an end portion 782 with a side surface 784 that follows the spherically curved matching surface 762, and the two of which cooperatively define a receiving space for receiving a solder ball 71, with the terminal side surface 784 in contact with the solder ball 71. After heating, the terminals and the circuit board are fixedly connected to achieve electrical connection.

Still further, in the electrical connector disclosed in R.O.C. Patent Publication No. 389430 and illustrated in FIG. 4, an electrical connector has a plate-like insulating housing 70 that is provided with a plurality of through holes 76. The edges of the through holes 76 which are proximate to a circuit board 8 are configured to have respective interior, recessed surfaces 764, the profile of which matches the shape of the solder ball 71. A plurality of terminals 78 are inserted into the through holes such that end portions 782 thereof respectively and slightly project in a straight direction from the interior recessed surfaces 764 of the through holes and contact with the solder balls 71. After heating, the terminals and the circuit board are fixedly connected to thereby establish electrical connection.

The present invention provides an improved electrical connector that utilizes solder balls as a means of connection, and which results in improved retention of the connector terminals and solder balls, as well as reduced operating height of the connector.

SUMMARY OF THE INVENTION

It is therefore a general object of the present invention to provide an improved electrical connector that reduces the distance between a mounting surface of an insulating housing and a circuit board so as to reduce the overall height after assembly, thereby achieving the object of compactization of electronic products.

Another object of the present invention is to provide an electrical connector which maintains the spherical shape of solder balls before and after soldering so as to obtain good connection with terminals and good electrical conductivity after connection.

A further object of the present invention is to provide an electrical connector that enables easy positioning and confinement of the solder balls and to avoid the drawback of poor electrical conductivity after soldering, which results from displacement of the solder balls caused by non-uniform expansion and contraction of the terminals and the circuit board during the soldering and heating process due to difference in the materials of the terminals and the circuit board.

The electrical connector of the present invention mainly provides an electrical connection between an electronic component (such as a central processing unit) and a circuit board. The present invention is characterized in that a depression is formed in one lateral edge of a mounting surface of an insulating housing of the electrical connector adjacent to a through hole, and that one end of a terminal extends through an opening of the through hole, bends, and is positioned in the depression to thereby form a mounting portion for attachment of a solder ball thereto. The structure includes: an insulating housing, the insulating housing having a receiving surface for receiving an electronic component, and a mounting surface disposed to be proximate to the circuit board, a plurality of terminal through holes being disposed between the receiving surface and the mounting surface, the mounting surface being provided with depressions each of which is adjacent to an opening of a respective one of the through holes and is sunken toward the interior of the insulating housing; and a plurality of conductive terminals respectively disposed in the through holes such that when a respective one of the terminals is disposed in the respective through hole, a free end thereof extends outwardly of the opening of the respective through hole in the mounting surface and bends obliquely toward the depression so that the free end of the terminal is located in the depression to form a mounting portion and so that the solder ball is confined between the mounting portion and a side wall of the depression and can thus be positioned. The spherical shape of the solder ball and good connection can therefore be maintained. Furthermore, as the depression is sunken into the interior of the insulating housing, the distance between the circuit board and the insulating housing after soldering can be reduced to thereby reduce the height of the assembly of the circuit board and the electrical connector.

The technical means employed by the present invention in order to achieve the aforesaid objects and features, and the effects of the invention are described hereinafter by way of the preferred embodiments with reference to the accompanying drawings, in which like reference numerals identify like parts.

DETAILED DESCRIPTION OF THE PREFERRED EMBODIMENTS

Figure 1:
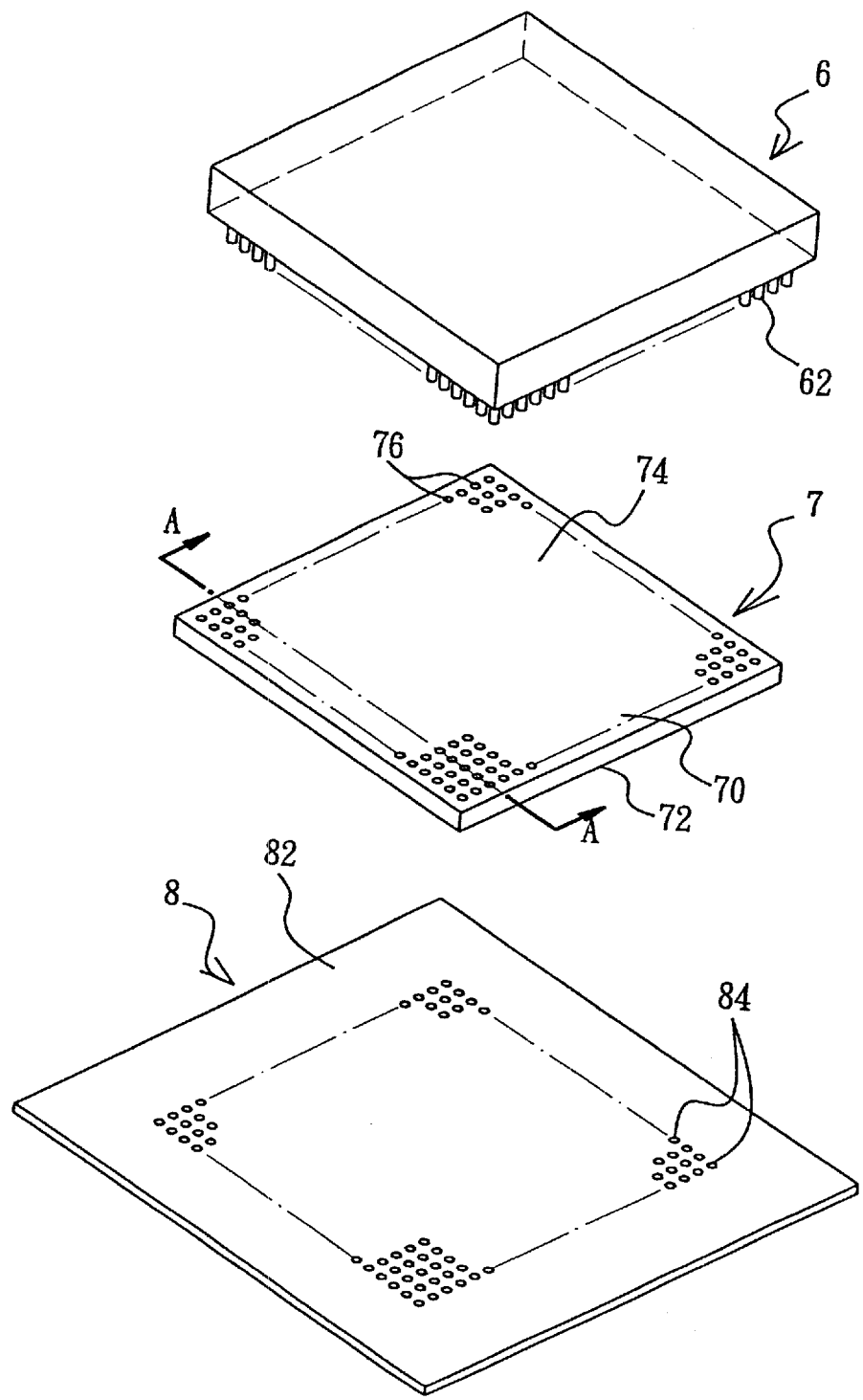
FIG. 1 is a schematic view illustrating a conventional electrical connector, and the relationship among the connector, an electronic component and a circuit board.
Figure 2:
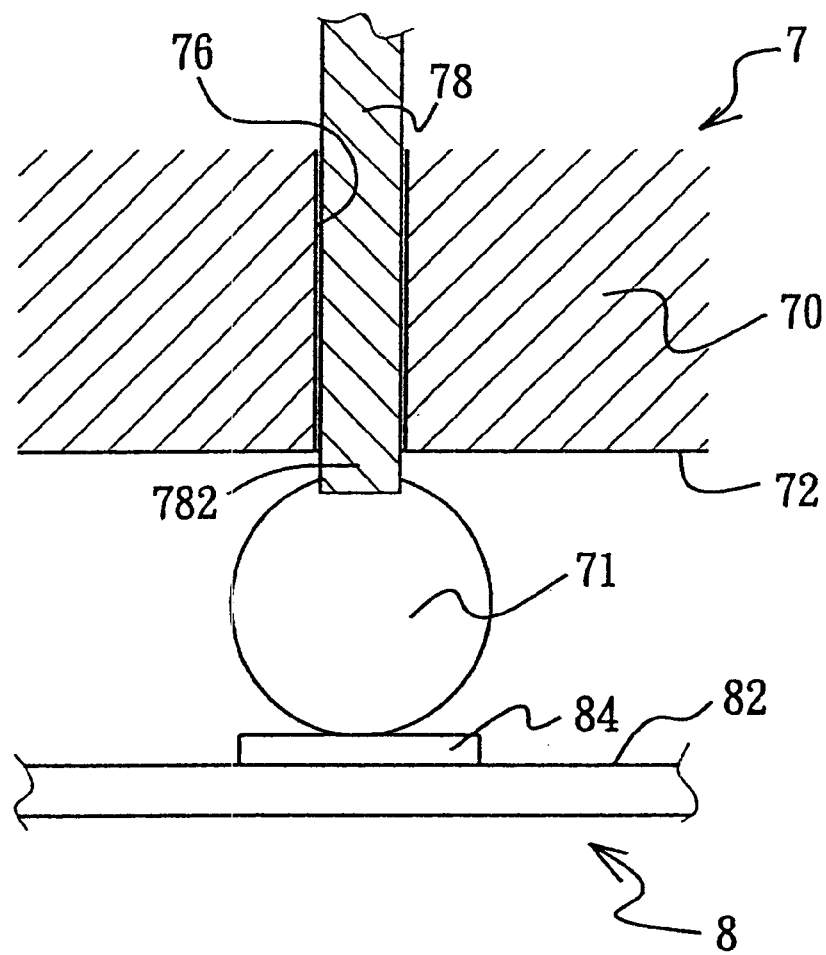
FIG. 2 is a sectional view of the conventional connector of FIG. 1, taken along lines A—A thereof.
Figure 3:
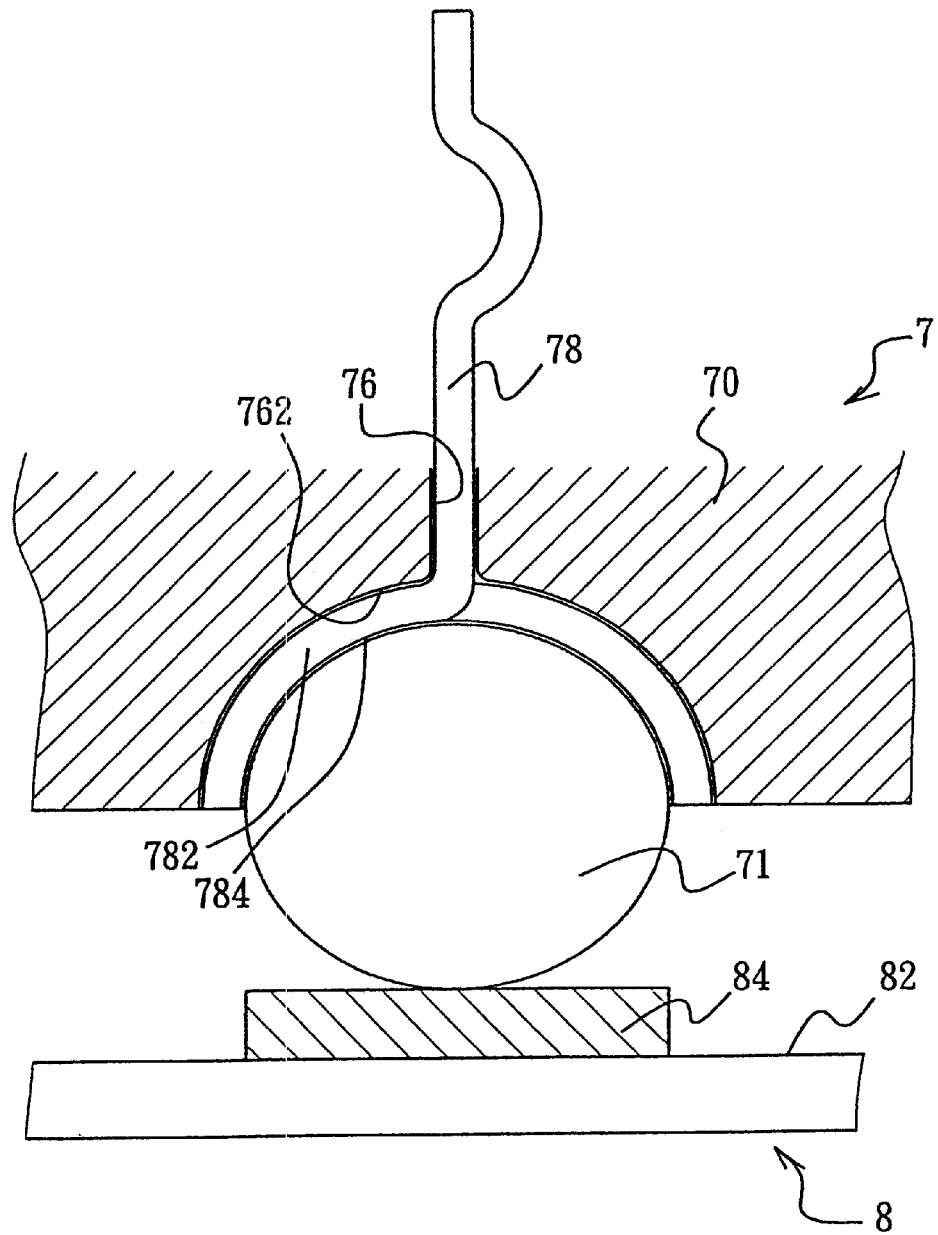
FIG. 3 is a partial sectional view illustrating the construction of another conventional electrical connector.
Figure 4:
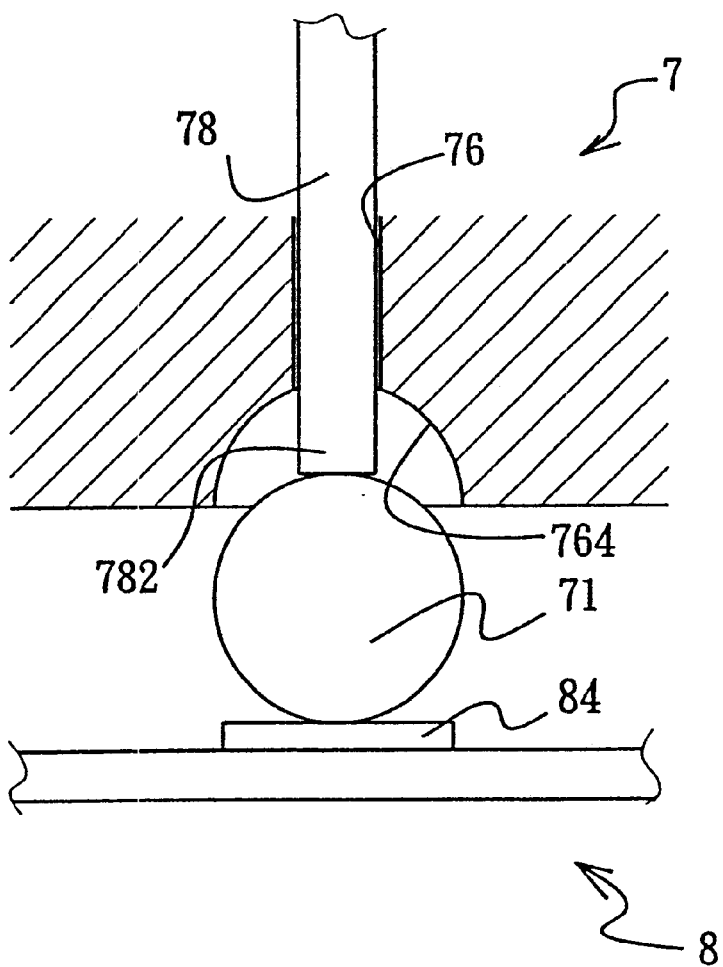
FIG. 4 is a partial sectional view illustrating the construction of still another conventional electrical connector.
Figure 5:
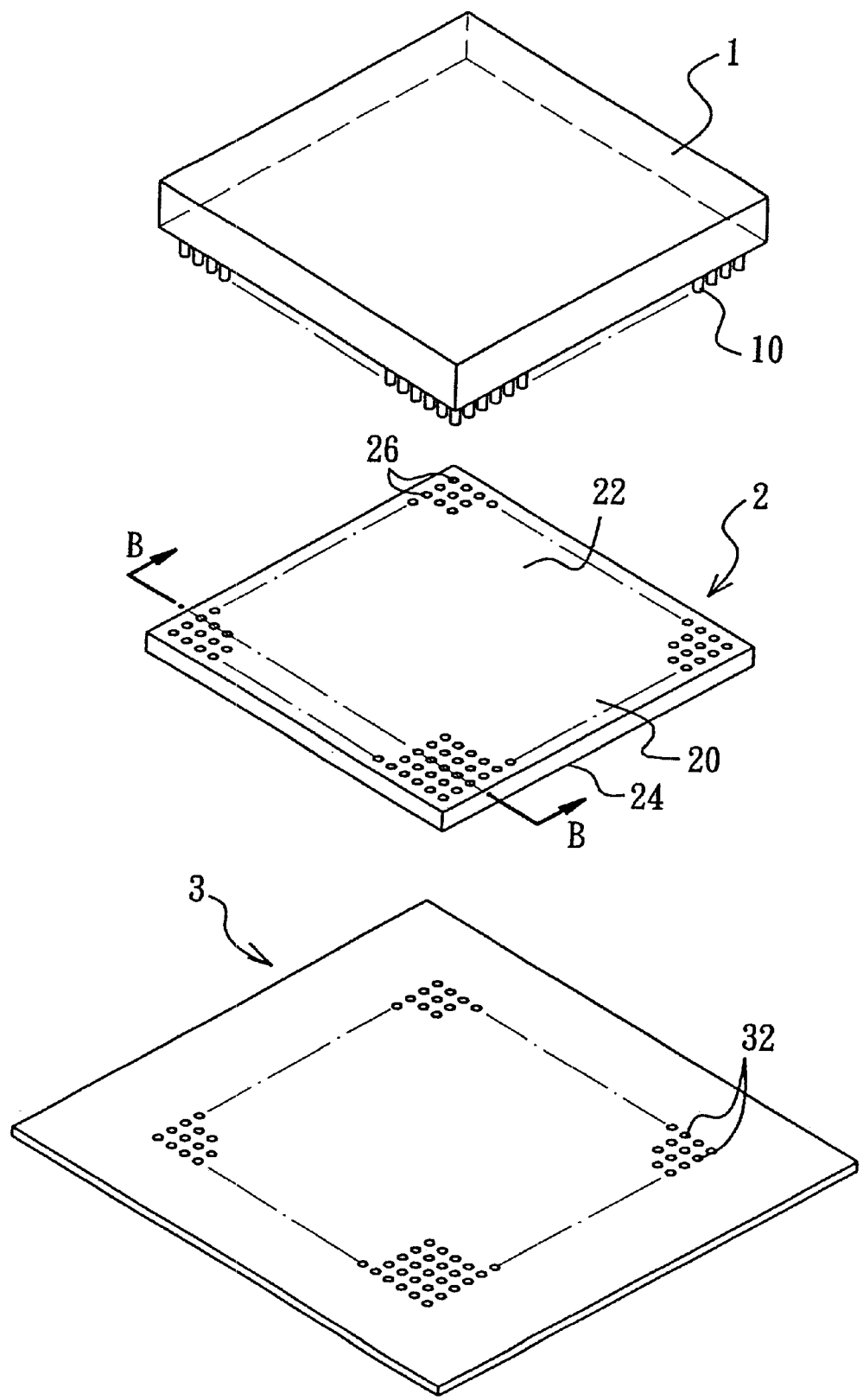
FIG. 5 is a schematic view illustrating an electrical connector constructed in accordance with the principles of the present invention, and illustrating the relationship among the connector, an electronic component supported by the connector, and a circuit board to which the connector is mounted.
Figure 6:
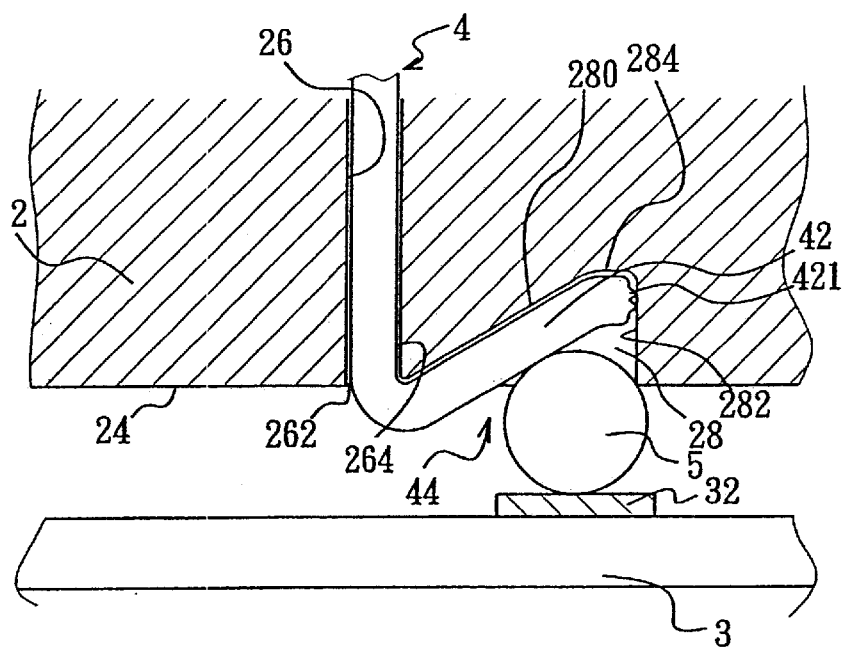
FIG. 6 is a partial sectional view of the connector of FIG. 5, taken along lines a–A thereof and illustrating one embodiment of a terminal-connector housing structure.

Referring now to FIG. 5, which is a schematic exploded view illustrating the relative relationship among an electrical connector 2, an electronic component 1 and a circuit board 3 in assembly, and FIG. 6, a first embodiment of the electrical connector 2 according to the present invention is shown to include: a connector having an insulating housing 20, the insulating housing 20 having a receiving surface 22 for receiving, or supporting an electronic component 1 thereon, and a mounting surface 24 that is disposed opposite the circuit board 3. A plurality of terminal through holes 26 are provided in the circuit board 2, and these through holes 26 extend between the receiving and mounting surfaces 22, 24 of the circuit board 2. The through holes communicate with the mounting surface 24 of the circuit board by way of openings 262. The circuit board, and particularly the mounting surface thereof, preferably includes a cavity, recess or depression that is formed therein and which is positioned proximate to the opening 262 of the through hole 26, and preferably adjacent to the through hole opening 262. Each such depression is sunken, or extends toward the interior of the connector insulating housing 20, away from the mounting surface 24 of the connector housing 2.

In the embodiment illustrated in FIG. 6, the depression 28 has a generally trapezoidal configuration and is cooperatively defined by a first wall 280, a second wall 282 and a third wall 284. The first wall 280 is inclined extending inwardly at one end of from a near side wall 264 of the through hole 26, while the second wall 282 extends in a generally upright fashion to the mounting surface 24 of the connector housing 2. A third wall 284 is provided to interconnect the first and second walls 280, 282 together. The third wall 284 extends preferably generally parallel to the connector housing mounting surface 24 is connected to the far end of the first wall 280 and the inner end of the second wall 282, thereby forming the generally trapezoidal configuration of the depression 28 illustrated in FIG. 6 that opens toward the mounting surface 24.

A plurality of conductive terminals 4 are respectively received in the through holes 26 of the insulating housing 20 so that each through hole 26 receives a single terminal 4. Each of the terminals 4 has a first contact end (not shown) which is oriented toward the receiving surface 22 for contacting a leg, or pin, 10 of the electronic component 1, and a second contact, or free end, 42 that extends outwardly through the through hole opening 262 in the mounting surface 24. This terminal free end 42 turns back upon itself in an opposite direction into the mounting surface 24 of the connector housing 20 and extends obliquely toward its associated depression 28 of the connector insulating housing 20 so that the terminal free end 42 is received within the depression 28 to thereby define a mounting portion 44 of the terminal 4. This bending of the terminal free end back upon itself and into its associated depression serves to reduce the overall height of the connector.

The terminal free end 42 preferably also includes an interference portion 421, such as a barb, point or the like that interferingly engages an opposing surface of the depression second wall 282 or even the surface of the depression third wall 284. This assists in retaining the terminal free end 42 in the depression 28 in a more stable manner, thereby setting the relative location of the terminal mounting portion 44 and the second wall 282 of the depression to thereby enable easy positioning of a solder ball 5. An edge or point is formed at the location where the depression first wall 280 and the sidewall 264 of the through hole meet and thereby defines an anvil or fulcrum, against which the terminal free end 42 may be bent into its location in the depression 28. This facilitates manufacture because a complementary-shaped stamping member may be made and used to bend the terminal free ends into place within their associated depressions. In operation, the terminals 4 of this connector are fixedly connected to corresponding contacts 32 on the circuit board 2 by heating the solder balls 5 to thereby establish electrical connection between the connector terminals 4 and the circuit board contact pads 32.

Figure 7:
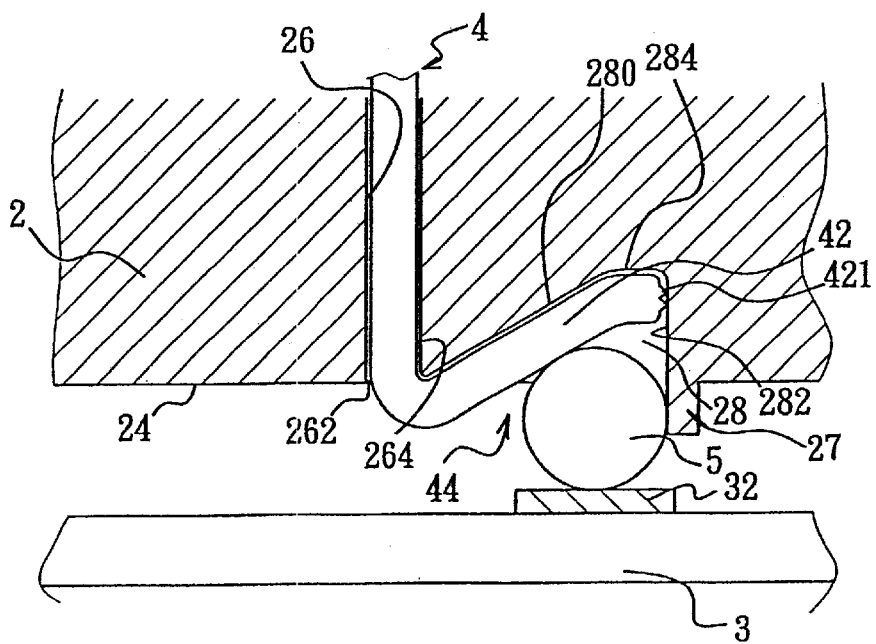
FIG. 7 is a partial sectional view of a connector constructed in accordance with the principles of the present invention and illustrating a second embodiment of a terminal-connector housing structure.

FIG. 7 illustrates a second embodiment of a terminal-connector housing structure in accordance with the principles of the present invention, which is similar to the first embodiment, but which differs in the structure of the connector housing 2. In this embodiment, the connector housing 20 includes a flange 27 that projects outwardly from the mounting surface 24 of the connector 2, and preferably in alignment with the second wall 282 of the depression 28 such that the length of the second wall 282 is extended as compared to the length of it in the first embodiment illustrated in FIG. 6. The solder balls 5 in this embodiment may abut the flange for more accurate positioning. By virtue of the mounting portion 44, the second side wall 282 of the depression 28, and the flange 27, the positioning of the solder ball 5 on the free end 42 of the terminal 4 is made easy. After heating, the terminals are fixedly connected to the corresponding contacts 32 on the circuit board to thereby establish electrical connection.

Figure 8:
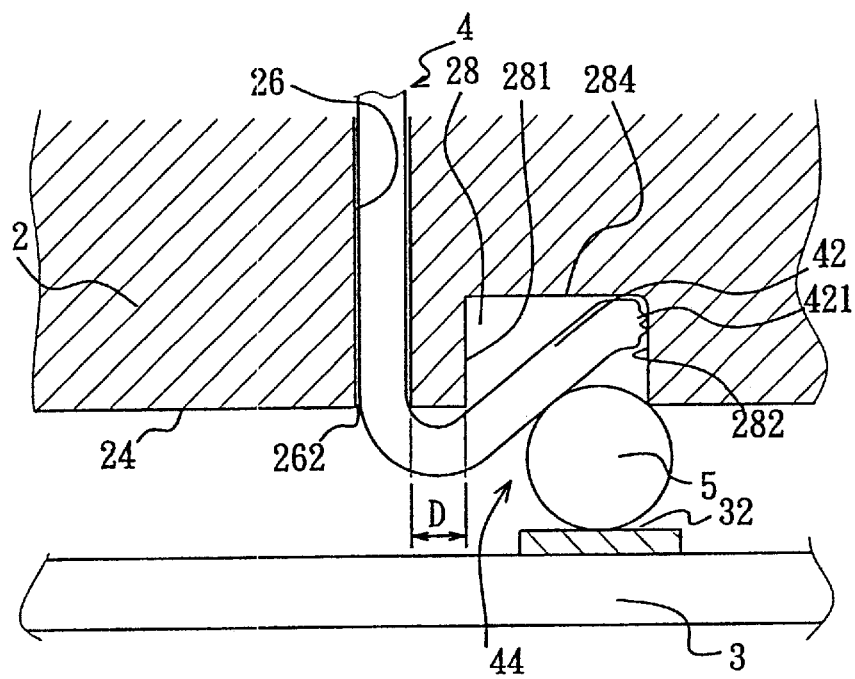
FIG. 8 is a partial sectional view of a connector constructed in accordance with the principles of the present invention and illustrating a third embodiment of a terminal-connector housing structure; and, FIG. 9 is a partial sectional view of a connector constructed in accordance with the principles of the present invention and illustrating a fourth embodiment of a terminal-connector housing structure.

FIG. 8 illustrates a third embodiment of a terminal-connector housing structure constructed in accordance with the principles of the present invention, which is also similar to the structure of the first embodiment. The difference in this embodiment resides in that the configuration of the depression 28 is a generally rectangular in configuration. That is, the depression is defined by three walls: an upright first wall 281 that is spaced apart from the opening 262 of an associated through hole 26, an upright second wall 282 that is spaced apart from and opposite to the first wall 281, and a third wall 284 that interconnects the first and second walls 281 and 282 together. The third wall 284 may be parallel to the connector housing mounting surface 24. The depression 28 is spaced from the through hole 26 a distance D from a sidewall 264 of the through hole. As such, the first wall 281, the third wall 284 and the second wall 282 together cooperatively form the rectangular shape of the depression 28 that opens toward the mounting surface 24.

A plurality of conductive terminals 24 are received in the through holes 26 of the insulating housing 20. Each terminal 4 has one end (not shown) oriented toward the receiving surface 22 of the connector 2 for contacting a leg 10 of an opposing electronic component 1, and has a free end 42 that extends outwardly of the through hole opening 262 along the mounting surface 24. This free end 42 is bent over the surface, or wall, defined by the depression first wall 281 and the through hole sidewall 264 so that it preferably abuts against the edge of the first wall 281 and contacts the intervening portion of the mounting surface 24 along distance D as illustrated. The intervening portion that extends for distance D acts as the fulcrum, on anvil, against which the terminal free end 42 may be bent into the associated depression 28. The terminal free end 42 further extends into the interior of the connector housing 2, past the mounting surface 24 thereof and is further preferably disposed obliquely toward and into the associated, adjacent depression 28. In this orientation, the terminal free end 42 is oriented toward the juncture of the second wall 282 and third wall 284, and thereby forms a mounting portion 44. The free end 42 has a protruding interference portion 421, such as a barb, point or the like which interferingly engages the surface of either of the upright second or third walls 282, 284 of the depression 28. This engagement retains the terminal free end 42 in the depression 28 in a more stable manner, whereby the mounting portion 44 and the wall surface of the second wall 282 of the depression enable easy positioning of a solder ball 5. After heating, the terminals are fixedly connected to corresponding contacts 32 on the circuit board to achieve electrical connection.

Figure 9:
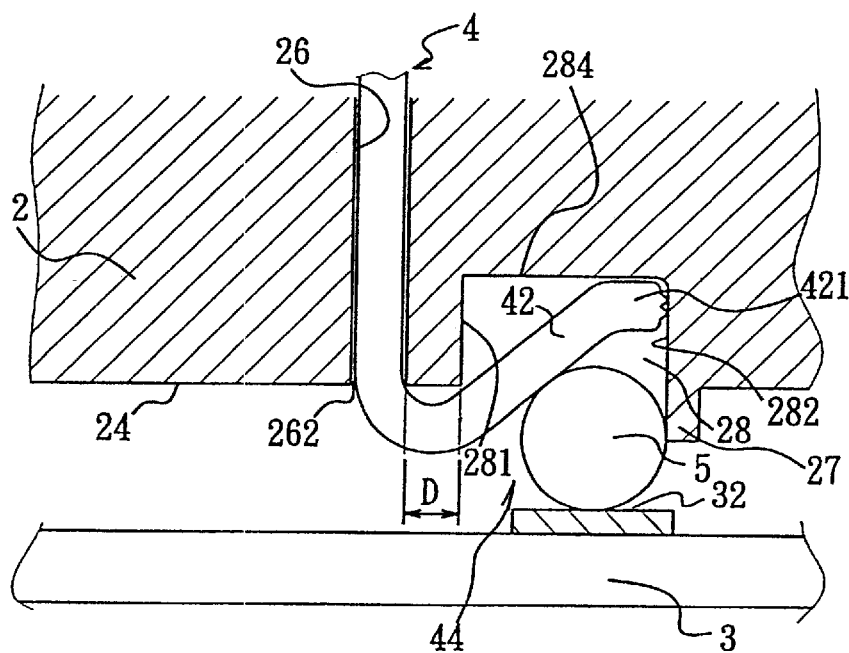

Lastly, FIG. 9 illustrates a fourth embodiment of a terminal-connector housing structure constructed in accordance with the principles of the present invention, which is similar to the structure of the third embodiment, but which includes a projection, in the form of a flange 27 projecting outwardly from the connector housing 2 along the upright second wall 282 of the depression 28 toward the mounting surface 24. This flange 27, in effect, extends the length of the depression second wall 282 so that the solder ball 5 may be placed into contact therewith when mounting the solder ball 5 to the terminal 4. By virtue of the mounting portion 44, the second wall 282 of the depression 28, and the flange 27, positioning of a solder ball 5 is made easy. After heating, the terminals are fixedly connected to corresponding contacts on the circuit board to thereby establish electrical connection.

In sum, the electrical connector according to the present invention can indeed achieve the intended objects and effects by virtue of the construction disclosed above. The terminal free ends 42 and the second walls 282 of the depression cooperate to in effect form a receptacle for receiving the solder balls 5. The terminal free ends 42 provide a mounting surface to which the solder balls 5 are attached, while the second walls 282, whether flanged or not, may contact the solder balls to hold them in position on the terminals 4. The aforesaid drawings and description are intended to illustrate the embodiments of the present invention and not to limit the present invention. Any equivalent arrangements or modifications made within the scope of the features of the present invention by a person skilled in the art should be deemed to fall within the scope of the claims of the subject application.

What is claimed is:

1. An electrical connector for electrically connecting an electronic component to a circuit board by way of at least one solder ball, comprising:

an insulative connector housing, the connector housing having a support surface for supporting the electronic component, and a mounting surface spaced apart from the support surface and facing the circuit board, a plurality of through holes disposed in said connector housing, each of the through holes extending through said connector housing between said support surface and the mounting surface, said connector housing further including a plurality of cavities formed in said mounting surface thereof, each of the cavities being associated with a single through hole and disposed on said mounting surface adjacent said associated through hole, each said cavity extending inwardly within said connector housing and wherein said cavity includes at least three walls that cooperatively define a trapezoidal configuration of said cavity; and, a plurality of conductive terminals supported by said connector housing, a single terminal being disposed in a single through hole, each of the terminals having a body portion and a free end portion, the body portion being received within said through hole, said free end portion extending and bent obliquely away from said body portion so that said free end is received with an associated cavity such that when a respective one of said terminals is disposed in the respective through hole, said free end portion defining a solder ball mounting portion to which is attached a single solder ball.

2. The electrical connector as claimed in claim 1, wherein said terminal free end portion includes an interference portion for interferingly engaging a portion of said cavity.

3. The electrical connector as claimed in claim 2, wherein said terminal interference portion includes at least one barb for engaging a surface of said cavity.

4. The electrical connector as claimed in claim 1, wherein said cavity is spaced apart from said through hole by an intervening portion of said circuit board over which said free end portion is bent.

5. The electrical connector as claimed in claim 1, wherein said cavity includes distinct first, second and third walls, the cavity first wall including an inclined surface extending into said cavity, the cavity second wall including an upright wall spaced apart from said cavity first wall, and the cavity third wall interconnecting said cavity first and second walls together, said cavity first wall extending between said cavity third wall and an edge of said through hole opening along said connector housing mounting surface.

6. The electrical connector as claimed in claim 1, wherein said cavity includes distinct first, second and third walls, the cavity first and second walls including upright walls and the cavity third wall interconnecting said cavity first and second walls together, said cavity first wall being spaced apart from an edge of said through hole opening along said connector mounting surface.

7. The electrical connector as claimed in claim 1, wherein said connector housing includes a plurality of projections disposed thereon, each of said cavities having one projection associated therewith, said projections projecting out from said connector housing mounting surface.

8. The electrical connector as claimed in claim 1, wherein said connector housing includes a plurality of projections disposed thereon, each of said cavities having one projection associated therewith, said projections projecting out from said connector housing mounting surface.

9. The electrical connector as claimed in claim 7, wherein said projections include flanges aligned with said cavity second walls and cooperate with said cavities to facilitate position of said solder ball upon said mounting portion.

10. The electrical connector as claimed in claim 8, wherein said projections include flanges aligned with said cavity second walls and cooperate with said cavities to facilitate position of said solder ball upon said mounting portion.

11. An electrical connector for connecting an electronic component to a circuit board, comprising:
a connector housing having opposite first and second surfaces, the connector housing first surface for attaching to the electronic component and the connector housing second surface for connecting with the circuit board, the connector housing having a plurality of passages extending therethrough between said connector housing first and second surfaces, said connector housing further having a plurality of depression formed in said connector housing second surface, one of each depression being associated with one of said passages, said depressions being disposed proximate to said passages and separated therefrom by intervening portions of said connector housing second surface; and,
a plurality of conductive terminals received in said connector housing passages, with one terminal being received within one of said passages, each terminal including a body portion received within said passage and a tail portion extending from said body portion and out of said passage at said connector housing second surface, the tail portion terminating in a free end portion, said tail portion being bent over the connector housing second surface intervening portion and said free end thereof extending into said associated depression to form a solder ball mounting portion of said terminal within said associated depression for receiving a solder ball for connecting said terminal to said circuit board by soldering.

12. The connector as set forth in claim 11, wherein said depression includes a plurality of distinct surfaces and said terminal free end portion interferingly engages one of said depression surfaces.

13. The connector as set forth in claim 12, wherein said terminal free end portion has at least one barb disposed thereon for engaging said depression one surface.

14. The connector as set forth in claim 12, wherein said connector housing further includes a plurality of projections formed on said second surface thereof, a single projection being associated with a single depression, said projection being aligned with said depression one surface to define a flange extending outwardly from said connector housing second surface, said flange defining an edge against which said solder ball abuts when said solder ball is mounted to said terminal mounting portion.

15. The connector as set forth in claim 12, wherein said depression has a rectangular configuration.

16. The connector as set forth in claim 12, wherein said depression has a trapezoidal configuration.

17. An electrical connector for connecting an electronic component to a circuit board, comprising:
a connector housing having opposite first and second surfaces for respective attachment to the electronic component and connection to the circuit board, the connector housing having a plurality of through holes disposed therein, the through holes extending between said connector housing first and second surfaces, said connector housing further having a plurality of cavities formed in said connector housing second surface, a single cavity being associated with a single through hole, and a flange extending from said cavity in a direction away from said cavity and extending beyond said second surface; and,
a plurality of conductive terminals disposed in said through holes, single terminals being disposed within single through holes, each terminal including a body portion extending within said through hole, and a tail portion extending from said body portion and out of said through hole at said connector housing second surface, the tail portion terminating in a free end, said tail portion being bent obliquely over a portion of said connector housing second surface and into said associated cavity to form a solder ball mounting portion of said terminal within said associated cavity for receiving a solder ball for connecting said terminal to said circuit board by soldering, said tail portion including a free end that engages said associated cavity and retains said solder ball mounting portion within said associated cavity.

18. The connector as set forth in claim 17, wherein said cavity is defined by at least two distinct surfaces, said terminal free end engaging one of said cavity surfaces, said cavity one surface extending generally parallel to said through hole to abuttingly contact a solder ball disposed on said solder ball mounting portion.

19. An electrical connector for electrically connecting an electronic component to a circuit board by way of at least one solder ball, comprising:
an insulative connector housing, the connector housing having a support surface for supporting the electronic component, and a mounting surface spaced apart from the support surface and facing the circuit board, a plurality of through holes disposed in said connector housing, each of the through holes extending through said connector housing between said support surface and the mounting surface, said connector housing further including a plurality of cavities formed in said mounting surface thereof, each of the cavities being associated with a single through hole and disposed on said mounting surface adjacent said associated through hole, each said cavity extending inwardly within said connector housing and wherein said cavity includes at least three walls that cooperatively define a rectangular configuration of said cavity; and, a plurality of conductive terminals supported by said connector housing, a single terminal being disposed in a single through hole, each of the terminals having a body portion and a free end portion, the body portion being received within said through hole, said free end portion extending and bent obliquely away from said body portion so that said free end is received with an associated cavity such that when a respective one of said terminals is disposed in the respective through hole, said free end portion defining a solder ball mounting portion to which is attached a single solder ball.

20. An electrical connector for electrically connecting an electronic component to a circuit board by way of at least one solder ball, comprising:

an insulative connector housing, the connector housing having a support surface for supporting the electronic component, and a mounting surface spaced apart from the support surface and facing the circuit board, a plurality of through holes disposed in said connector housing, each of the through holes extending through said connector housing between said support surface and the mounting surface, said connector housing further including a plurality of cavities formed in said mounting surface thereof, each of the cavities being associated with a single through hole and disposed on said mounting surface adjacent said associated through hole, each said cavity extending inwardly within said connector housing; and, a plurality of conductive terminals supported by said connector housing, a single terminal being disposed in a single through hole, each of the terminals having a body portion and a bend portion, said bend portion being located between said body portion and said free end portion, wherein said body portion is received within said through hole and said free end is received within an associated cavity, said free end being located further away from said circuit board than said bend portion.

* * * * *